United States Patent
Kitano et al.

(10) Patent No.: US 10,297,797 B2
(45) Date of Patent: May 21, 2019

(54) METHOD FOR MANUFACTURING DISPLAY DEVICE

(71) Applicant: Japan Display Inc., Tokyo (JP)

(72) Inventors: Naomu Kitano, Tokyo (JP); Keisuke Ono, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/911,311

(22) Filed: Mar. 5, 2018

(65) Prior Publication Data

US 2018/0261803 A1 Sep. 13, 2018

(30) Foreign Application Priority Data

Mar. 8, 2017 (JP) ................. 2017-043717

(51) Int. Cl.
| | |
|---|---|
| *H01L 51/56* | (2006.01) |
| *H01L 51/00* | (2006.01) |
| *H01L 51/52* | (2006.01) |
| *H01L 27/32* | (2006.01) |

(52) U.S. Cl.
CPC .......... *H01L 51/56* (2013.01); *H01L 51/0021* (2013.01); *H01L 27/3244* (2013.01); *H01L 51/5234* (2013.01); *H01L 2227/323* (2013.01); *H01L 2251/306* (2013.01); *H01L 2251/308* (2013.01); *H01L 2251/5315* (2013.01); *H01L 2251/558* (2013.01)

(58) Field of Classification Search
CPC ......... H01L 27/3244; H01L 2251/5315; H01L 51/56; H01L 51/5234; H01L 51/0021; H01L 2227/323; H01L 2251/308; H01L 2251/306; H01L 2251/558
See application file for complete search history.

(56) References Cited

U.S. PATENT DOCUMENTS

2016/0087023 A1\* 3/2016 Maeda ................ H01L 27/3276
257/40
2017/0301538 A1\* 10/2017 Yamazaki ........... C23C 14/0036

FOREIGN PATENT DOCUMENTS

| JP | 2007-095338 A | 4/2007 |
|---|---|---|
| JP | 2012-012633 A | 1/2012 |

\* cited by examiner

*Primary Examiner* — Thanh Y. Tran
(74) *Attorney, Agent, or Firm* — Typha IP LLC

(57) ABSTRACT

A method for manufacturing a display device includes forming an insulating layer embedding a transistor arranged on a substrate, forming a first electrode electrically connected with the transistor above the insulating layer, forming a partition wall layer having an opening part covering a periphery edge part of the first electrode and exposing an inner side region of the first electrode, forming an organic layer including an organic electroluminescent material above the first electrode, forming a second electrode above the partition layer and the organic layer, and forming a sealing layer above the second electrode. Deposition of the second electrode includes a film deposition step of an electrode layer having a thinner film thickness than a target film thickness of the second electrode, and a waiting step after completion of the deposition step of the electrode layer.

13 Claims, 10 Drawing Sheets

METHOD FOR MANUFACTURING DISPLAY DEVICE

CROSS REFERENCE TO RELATED APPLICATIONS

This application is based upon and claims the benefit of priority from the prior Japanese Patent Application No. 2017-043717, filed on Mar. 8, 2017, the entire contents of which are incorporated herein by reference.

FIELD

One embodiment of the present invention is related to a method of manufacturing a display device. One embodiment of the invention disclosed in the present specification is related to a method of manufacturing a conductive film (including a conductive film constituting an electrode which forms an element) which can be applied to the manufacture of a display device.

BACKGROUND

An organic electroluminescent element (hereinafter also referred to as "organic EL element") using an organic electroluminescent material (hereinafter also referred to as "organic EL material") is known as one type of light emitting element. An organic EL element has a structure in which a first electrode (anode), an organic layer, and a second electrode (cathode) are stacked. A display device in which an organic EL element is arranged in a pixel is classified into a bottom-emission type and a top-emission type depending on the direction of light emitted from a pixel. In the top-emission type display device, an electrode arranged on an upper surface of the organic layer, for example, a second electrode (cathode), is fabricated from a transparent conductive film such as indium tin oxide.

In an organic EL device, in the case when the second electrode (cathode) arranged on the organic layer is used as a surface for emitting light, the second electrode (cathode) is not only merely high in translucency but is required so that damage does not reach an organic layer which is an underlying surface when forming a transparent conductive film. A transparent conductive film such as indium tin oxide is fabricated by a sputtering method. When an electrode of an organic EL element is fabricated by a sputtering method, effort is put in devising the film deposition conditions so that the organic layer is not damaged by ions generated by a plasma or high energy electrons (for example, refer to Japanese Laid Open Patent Publications No. 2007-095338 and No. 2012-012633).

A display device in which pixels are formed with an organic EL element is arranged with a sealing layer is provided in a region where pixels are arranged so that the organic EL element does not deteriorate due to moisture or the like. If a pinhole, crack or defect due to a defect in the film is present in the sealing layer, moisture can enter from the defective part and the organic layer will deteriorate. There are various causes for defects being formed in a sealing layer. For example, if dust adheres to an underlying surface during the manufacturing process, it causes defects to be generated in the sealing layer.

SUMMARY

A method for manufacturing a display device in an embodiment according to the present invention, the method includes forming an insulating layer embedding a transistor arranged on a substrate, forming a first electrode electrically connected with the transistor above the insulating layer, forming a partition wall layer having an opening part covering a periphery edge part of the first electrode and exposing an inner side region of the first electrode, forming an organic layer including an organic electroluminescent material above the first electrode, forming a second electrode above the partition layer and the organic layer, and forming a sealing layer above the second electrode. Deposition of the second electrode includes a film deposition step of an electrode layer having a thinner film thickness than a target film thickness of the second electrode, and a waiting step after completion of the deposition step of the electrode layer, the film deposition step and the waiting step being repeated until the target film thickness is reached.

DESCRIPTION OF EMBODIMENTS

Hereinafter, the embodiments of the present invention will be described while referencing the drawings. However, the present invention may be implemented in many different ways, therefore interpretation should not be limited to the content exemplified in the embodiments below. In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols (numbers followed by a, b, and the like) and detailed descriptions are omitted accordingly. Furthermore, characters labeled as "first" and "second" are symbols used to distinguish each element, and do not have any further meaning unless otherwise specified.

In this specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a sectional view, the side on which the second substrate is located with respect to the substrate will be described as "above" and the other side will be described as "below."

First Embodiment

Figure 1:
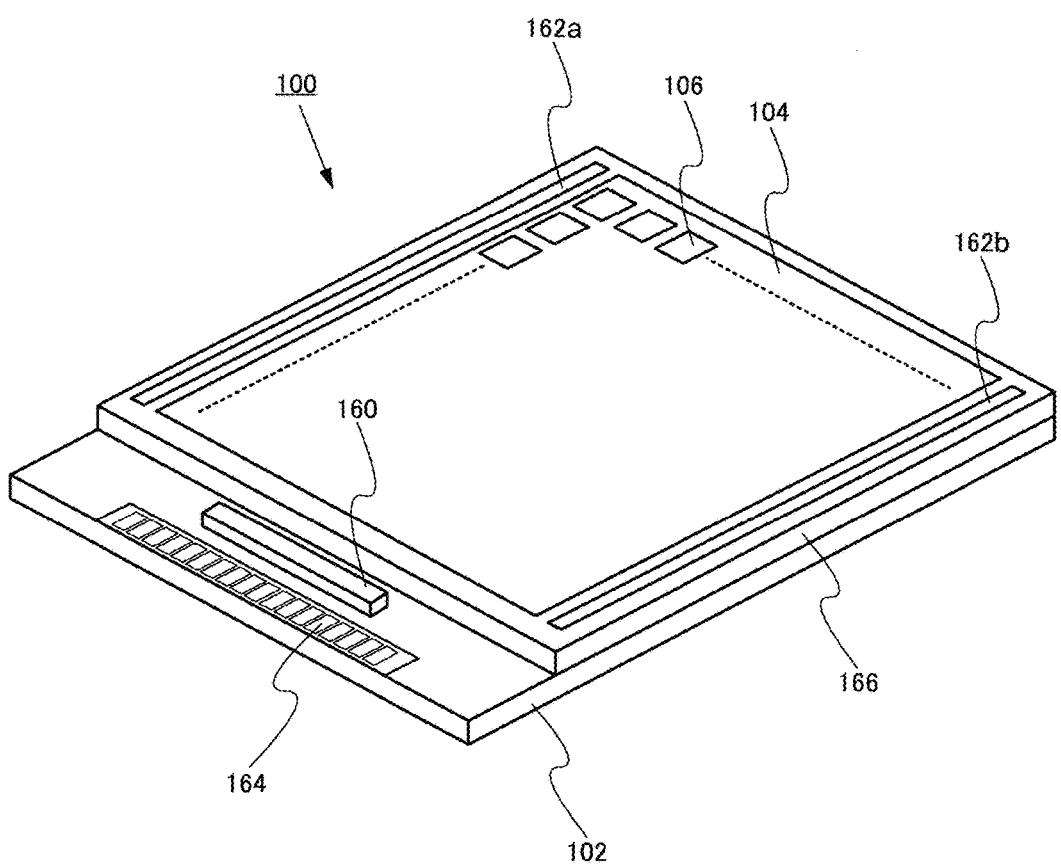
FIG. 1 is a perspective view diagram showing a structure of a display device related to one embodiment of the present invention.
Figure 2:
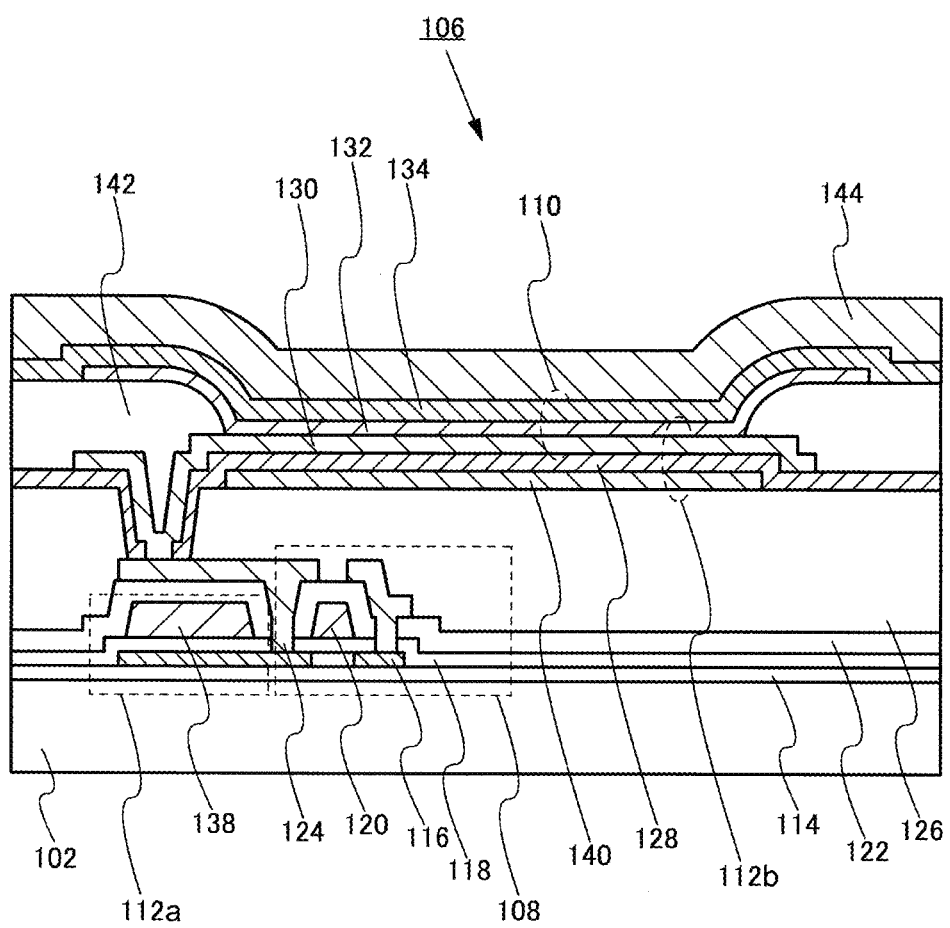
FIG. 2 is a cross-sectional diagram showing a structure of a pixel in a display device related to one embodiment of the present invention.

FIG. 1 and FIG. 2 show the structure of a display device according to one embodiment of the present invention. FIG. 1 is a perspective view of a display device 100 and FIG. 2 is a cross-sectional view of a pixel.

In FIG. 1, the display device 100 is arranged with a pixel part 104, a first drive circuit 160, second drive circuits 162a and 162b and a terminal part 164 on a first surface of a substrate 102. A plurality of pixels 106 are arranged in a row direction and a column direction in the pixel part 104 and forms a display screen in the display device 100. The first drive circuit 160 is, for example, a video signal line drive circuit which outputs a video signal to a data signal line. The second drive circuits 162a and 162b are, for example, scanning signal line drive circuits which output scanning signals to a scanning signal line. A cover member 166 is used as a protective member of the plurality of pixels 106 and is arranged so as to cover substantially an entire surface of the pixel part 104.

FIG. 2 shows a cross-sectional structure of a pixel of the plurality of pixels 106 in this type of display device 100. Each of the plurality of pixels 106 includes at least a transistor 108, an organic EL element 110 and a capacitor (for example, a first capacitor 112a and second capacitor 112b). Each of the plurality of pixels 106 has a structure in which the transistor 108 and the organic EL element 110 are stacked on the first surface of the substrate 102 via an insulating layer. In each of the plurality of pixels 106, at least a transistor 108 is electrically connected to the organic EL element 110. A current (drain current) flowing between the source and drain of the transistor 108 is controlled by a voltage of a video signal applied to the gate. In the organic EL element 110, the light emission intensity is controlled by the drain current of the transistor 108. The first capacitor element 112a holds a gate-source voltage of the transistor 108, and the second capacitor element 112b is arranged as appropriate in order to adjust the amount of current flowing through the organic EL element 110.

An underlying insulating layer 114 is arranged on the first surface of the substrate 102 on which the transistor 108 and the organic EL element 110 are arranged. The transistor 108 has a structure in which a semiconductor layer 116, a gate insulating layer 118, and a gate electrode 120 arranged above the underlying insulating layer 114 are stacked. The semiconductor layer 116 is formed of a semiconductor material such as amorphous silicon or polycrystalline silicon or a metal oxide semiconductor. The semiconductor layer 116 is insulated from the gate electrode 120 by the gate insulating layer 118. The semiconductor layer 116 also arranged so as to be in contact with a source/drain electrode 124 arranged via a first insulating layer 122. The first insulating layer 122 is arranged as an interlayer insulating film for electrically separating the gate electrode 120 from the source/drain electrode 124. A second insulating layer 126 is arranged above the first insulating layer 122 to embed the transistor 108 and a source/drain electrode 124 electrically connected to the transistor 108. The second insulating layer 126 is used as a planarization film that fills in irregularities caused by the semiconductor layer 116, the gate electrode 120 and the source/drain electrode 124 and provide a flat surface. The first insulating layer 122 may be formed from an inorganic insulating film such as a silicon oxide film, a silicon oxynitride film or a silicon nitride film. The second insulating layer 126 may be formed from an organic insulating film such as polyimide resin or acrylic resin and the like.

The organic EL element 110 is arranged on the upper side of the second insulating layer 126. The organic EL element 110 has a structure in which a first electrode 130, an organic layer 132 and a second electrode 134 are stacked. The first electrode 130 is electrically connected to the source/drain electrode 124 via a contact hole 136a which passes through the second insulating layer 126. The organic EL element 110 is a two-terminal element, and light emission is controlled by the size of the voltage applied between the first electrode 130 and the second electrode 134. The potential of the first electrode 130 is individually controlled for each of the plurality of pixels 106, and a common potential to the plurality of pixels 106 is applied to the second electrode 134. The first electrode 130 is arranged for each of the plurality of pixels 106, and the second electrode 134 is arranged as one electrode over substantially the entire region where each of the plurarity of pixels 106.

The first capacitor element 112a is arranged in a region where the semiconductor layer 116 and the first capacitor electrode 138 overlap using the gate insulating layer 118 as a dielectric. The second capacitor element 112b is arranged in a region where the first electrode 130 and a second capacitor electrode 140 overlap the first electrode 130 overlap using a third insulating layer 128 as a dielectric.

A partition wall layer 142 which covers a periphery part of the first electrode 130 and exposes the inner region is arranged above the second insulating layer 126. The organic layer 132 is arranged above the first electrode 130 which is exposed from the partition wall layer 142. Specifically, the organic layer 132 is arranged to be in contact with the first electrode 130 at an opening part of the partition wall layer 142 and is further arranged along a surface of the partition wall layer 142. The second electrode 134 is arranged to cover upper surfaces of the organic layer 132 and the partition wall layer 142. The partition wall layer 142 is formed from an organic resin material in order to form a smooth step at the opening end which exposes the first electrode 130. Acrylic resin or polyimide resin and the like is used as the organic resin material.

The organic layer 132 is a layer which includes a low molecular weight or high molecular weight organic EL material. In the case where a low molecular organic EL material is used, the organic layer 132 includes a light emitting layer containing an organic EL material, and further includes a carrier injection layer (hole injection layer, electron injection layer) and a carrier transport layer (hole transport layer, electron transport layer) sandwiching the light emitting layer. For example, the organic layer 132 has a structure in which a light emitting layer is sandwiched between a hole injecting layer and an electron injecting layer. In addition to the hole injecting layer and the electron injecting layer, the organic layer 132 may be appropriately included with a hole transporting layer, an electron transporting layer, a hole blocking layer and an electron blocking layer and the like. Even when a plurality of layers is stacked, the total thickness of the organic layer 132 is about 100 nm to 200 nm.

In the present embodiment, the organic EL element 110 has a so-called top emission type structure in which light emitted from the organic layer 132 is emitted to the second electrode 134 side. As a result, the first electrode 130 is formed from a metal film or a layer including a metal film so as to reflect the light emitted from the organic layer 132. For example, the first electrode 130 is formed from a metal layer with light reflecting properties such as aluminum (Al) and silver (Ag) or the like. In addition, the first electrode 130 has a stacked structure of metal film and a transparent conductive film such as indium tin oxide (also referred to as "ITO" below), indium zinc oxide (also referred to as "IZO" below), zinc oxide added with aluminum (also referred to as "AZO" below) and zinc oxide added with gallium (also referred to as "GZO" below).

On the other hand, the second electrode 134 is preferred to be formed from a transparent conductive film such as ITO, IZO, AZO and GZO or the like in order to emit light emitted from the organic layer 132 to the exterior. Since the second electrode 134 is formed across a plurality of pixels, it is required not only to have translucency but also low resistance (low sheet resistance). For example, it is preferred that the sheet resistance of the second electrode 134 is 10 Ω/sq. or less and preferably 5 Ω/sq. or less. The film thickness may be increased in order to reduce the sheet resistance of the second electrode 134. However, when the film thickness of the second electrode 134 is increased, transmittance decreases. Therefore, the second electrode 134 is formed to have a film thickness in a preferred range of 100 nm to 300 nm, for example, 200 nm.

A sealing layer 144 is arranged on the upper surface of the second electrode 134. The sealing layer 144 is a protective film for preventing the entrance of moisture into the organic EL element 110. Therefore, an inorganic insulating film having low water vapor permeability is used as the sealing layer 144. For example, an inorganic insulating film such as a silicon nitride film or an aluminum oxide film is used as the sealing layer 144. The thickness of the inorganic insulating film used as the sealing layer 144 is in the range of 0.5 μm to 10 μm and preferably 2 μm to 5 μm. Although a thick sealing layer 144 improves the barrier property against water vapor and the like, since light transmittance in the short wavelength band is particularly reduced, the thickness of the sealing layer 144 is preferred to be in the range described above.

In addition, the sealing layer 144 may have a structure in which an inorganic insulating film and an organic resin film are stacked alternately. By utilizing the fluidity of a composition in the organic resin film before curing, it is possible to obtain a flat surface whereby the unevenness of the underlying surface is filled. Therefore, by alternately stacking the inorganic insulating film and the organic resin film, it is possible to increase the barrier properties to water vapor and the like. In this case, the film thickness of the organic resin film is preferred to be in the range of 1 μm to 10 μm, for example, 2 μm to 5 μm.

Even if the sealing layer 144 is formed using a dense film or a structure is adopted in which an inorganic insulating film and an organic resin film are combined providing redundancy with respect to the unevenness of the underlying surface, sealing ability decreases when there are foreign substances large enough so that the sealing layer 144 cannot cover the underlying surface. For example, a defect is formed in the sealing layer 144 if a large foreign substance adheres to the second electrode 134 which corresponds to the underlying surface of the sealing layer 144. For example, even if an inorganic insulating film having a film thickness of 5 μm is formed as the sealing layer 144 with foreign substances of 0.5 μm adhered to the underlying surface of the sealing layer 144, it is possible for the foreign substances to be buried and maintain barrier properties. However, in the case when the size of the foreign substance is equal to or larger than the thickness of the sealing layer 144, then the foreign substance cannot be buried, and defects are formed in the sealing layer 144.

The second electrode 134 which correspond to the underlying surface of the sealing layer 144 is formed by a sputtering method using a sintered body of a metal oxide such as ITO as a target. When referring to a sputtering method below, unless otherwise specified it is a magnetron sputtering method. In a magnetron sputtering method, a magnetic field is generated on the surface of the sputtering target by a permanent magnet or the like arranged on the rear surface of the sputtering target, secondary electrons generated by a plasma are captured by a Lorentz force, the frequency of ionization collision with the sputtering gas is increased by cycloid or trochoid motion, and a high-density plasma is generated near the target to apply sputtering.

In a film deposition step by a sputtering method, the specification of the sputtering target material and the film forming conditions are optimized in order to suppress generation of foreign substances (also called particles). For example, in ITO sputtering targets, in order to suppress the occurrence of nodules, the density of a sintered body is increased, and the occurrence of foreign substances caused by nodules is suppressed.

However, even with such measures, it is not sufficient in the manufacturing process of the display device 100 using an organic EL element. It is possible to remove foreign substances attached to the substrate by washing. However, because the organic layer 132 including an organic EL material deteriorates due to moisture, it is impossible to carry out an effective cleaning treatment after the organic layer 132 is formed. As a result, management of foreign substances which are generated when the second electrode 134 is manufactured is extremely important. In particular, during the manufacturing process of the second electrode 134, it is necessary to prevent foreign substances having a size that does not allow them to be buried in the sealing layer 144 from being generated.

In one embodiment of the present invention, an intermittent film deposition method in which film deposition by sputtering and vacuum evacuation are alternately applied in the film deposition step is employed. That is, in the film deposition method according to one embodiment of the present invention, the duration of film deposition by sputtering is set within a time period in which particles do not grow large, and vacuum evacuation (reduced pressure processing from sputtering pressure) is carried out for each single sputtering film deposition. For example, the deposition time per the film deposition process is set within the time during which particles of 5 μm or more do not grow, and a plurality of film deposition processes are carry out until the target film thickness is reached, an interval period is set between a certain film deposition process and the next film deposition process and vacuum evacuation is carried out in the interval period to apply film deposition by sputtering. By carrying out such an intermittent film deposition process, in the case of forming a thin film by a sputtering method, it is possible to reduce the adhesion of particles (objects observed as foreign substances on the substrate surface) to the deposition surface.

Furthermore, in the present embodiment, although the size of the particles is defined as 5 μm, this value may be appropriately changed according to the relationship with the film thickness of the sealing layer. That is, the film deposition time or the film deposition conditions may be set so that particles having a size equal to or larger than the film thickness of the sealing layer are not generated.

An analysis was carried out of foreign substances adhering to the substrate on which the IZO film was formed. As a result, it was discovered that at least two kinds of foreign substances different from each other, rounded foreign substances and angularly shaped foreign substances existed on the substrate on which the IZO was formed. The first foreign substance is a heterogeneous foreign substance having a length of about 6 μm and is rounded on the surface. The first foreign substance includes a core part and an outer skin part. Indium (In) and zinc (Zn) are both detected from (1) the core part and (2) the outer skin part, and it is inferred that this foreign substance is indium zinc oxide derived from the sputtering target. It is presumed that the foreign substances have a main component of indium zinc oxide flying due to sputtering in an amorphous state are adhered to the surface with the indium zinc oxide scattered from the sputtering target as a nucleus. On the other hand, the second foreign substance is a foreign substance having an angular shape. This angular shape foreign substance is also an L size foreign substance having a length of about 6 μm in a longitudinal direction.

Figure 3:
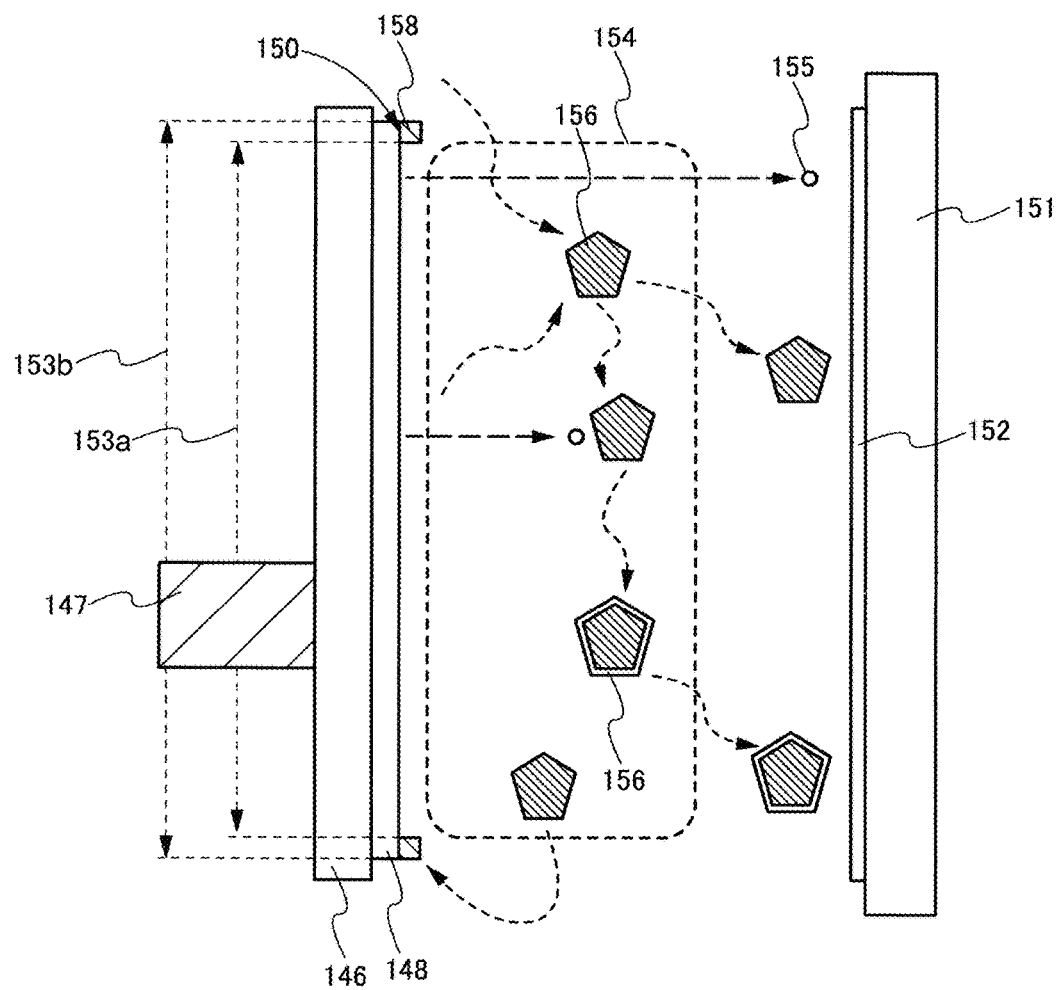
FIG. 3 is a diagram for explaining a generation mechanism of foreign substances.

The cause of the occurrence of two types of foreign substances is explained while referring to FIG. 3. FIG. 3 schematically shows the structure inside the chamber of a sputtering apparatus and shows a form in which a sputtering target 148 is fixed to a backing plate 146, a substrate 152 held by a substrate holder 151 opposed to the sputtering target 148. FIG. 3 also schematically shows a glow discharge plasma 154 is generated between the sputtering target 148 and the substrate holder 151. As is shown in FIG. 3, particles 156 which are scattered from the sputtering target 148 float within the chamber (particularly, a space between the sputtering target 148 and the substrate 152). Next, while the particles 156 within the chamber float in the glow discharge plasma 154, sputtered particles 155 adhere to the particles 156 which grow and increase in particle size. When the grown particles 156 adhere to the substrate 152, they are observed as a foreign substance having a rounded shape. Therefore, the foreign substances having a rounded shape has a form in which amorphous indium zinc oxide is adhered to the outer skin of the crystalline core part comprised from indium zinc oxide. Since a part corresponding to the outer skin is a deposit of a sputtered target component, the surfaces of the particles are rounded. That is, it is believed that a part of the particles 156 which are floating in the chamber and growing to a large particle size reaches and adheres to the film deposition surface of the substrate which is observed as an L size foreign substance (first mode).

Based on the first mode, it is effective to reduce the deposited film thickness per one time, repeat film deposition intermittently a plurality of times and carry out vacuum evacuation at during a standby time between each film deposition. It is observed that by intermittently carrying out film deposition, film deposition by sputtering is terminated before foreign substances grow large, and since foreign substances floating together with a sputtering gas are discharged by vacuum evacuation of the chamber, the L size foreign substances attached to the substrate can be reduced.

On the other hand, even if the film deposition is carried out intermittently, if the sputtering pressure is maintained during the standby time between each film deposition, since floating foreign substances remain in the chamber, it is believed that the number of foreign substances with the L size adhering to the substrate cannot be effectively reduced.

In the film deposition process by the sputtering method according to the present embodiment including a first film deposition step, a holding period, and a second film deposition step. The first film deposition step is of applying at least one kind of sputtering gas into a chamber of a sputtering apparatus and applying electric power to a sputtering target to deposit a thin film on a substrate. The holding period, the electric power applied to the sputtering target is cut off, and at least one kind of sputtering gas within the chamber is discharged and a vacuum state is maintained is carried out. The second film deposition step is applying at least one kind of sputtering gas into the chamber of the sputtering apparatus and applying electric power to the sputtering target to deposit a thin film on the substrate is carred out. According to the film deposition method of the present embodiment, it is possible to reduce the number of foreign substances having a large particle diameter which adhere to the substrate.

In such an intermittent film deposition method, it is preferred to control an accumulated value of the film thickness and to apply film deposition when the accumulated value of the film thickness is within a certain range.

Figure 4:
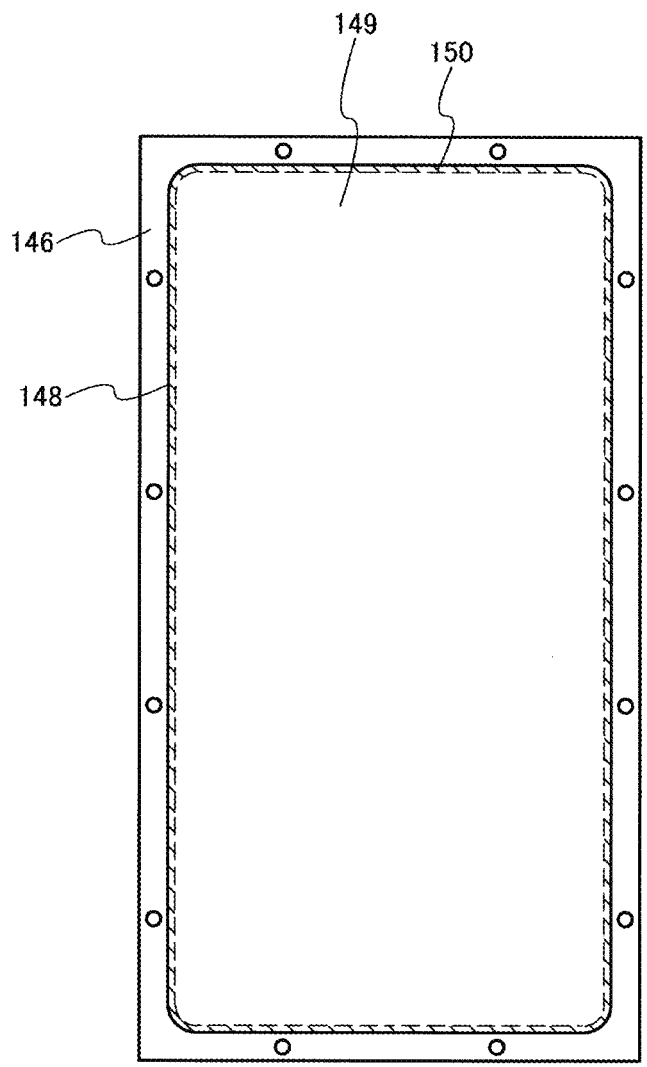
FIG. 4 is a diagram showing a non-erosion region and the results of observing generated substances adhering to the non-erosion region using an electron microscope.

The cause and location of generation of foreign substances having an angular shape are different from those foreign substances having a rounded shape. FIG. 4 shows a schematic diagram of a sputtering target. The sputtering target includes an erosion region 149 in which constituent elements are sputtered due to a sputtering phenomenon, and a non-erosion region 150 which is not sputtered. Since ions do not substantially irradiate the non-erosion region 150, a material sputtered from the sputtering target re-adheres to the non-erosion region 150 to form a deposit 158.

It is presumed that the angular shaped foreign substances adhering to the substrate are one in which the deposit 158 deposited in the non-erosion region 150 of the sputtering target shown in FIG. 4 are released and adhere to the substrate 152. The deposit 158 deposited in the non-erosion region 150 increases together with the accumulated value of the film thickness. When the thickness of the deposit 158 deposited in the non-erosion region 150 exceeds a certain range, it is believed that a situation occurs whereby it likely to scatter from the non-erosion region 150, and the ratio which adhere to the substrate 152 is increases (second mode).

It is possible to reduce the foreign substances generated in the second mode by removing the deposit 158 deposited in the non-erosion region 150 of the sputtering target. It is possible to remove the foreign substances deposited in the non-erosion region 150 of the sputtering target by cleaning treatment. Although it is possible to directly remove the deposit adhering to the non-erosion region 150 of the sputtering target by opening the chamber of the sputtering apparatus to the atmosphere, productivity is significantly deteriorated by this method. Therefore, in one embodiment of the present invention, the cleaning treatment is carried out by widening the range of the glow discharge plasma so that sputtering also takes place in the non-erosion region 150. Specifically, in the case of a moving magnet type magnetron sputtering apparatus, the cleaning treatment is carried out by swinging the swinging range 153b of the magnet 147 during cleaning as far as the non-erosion region 150 with respect to the swinging range 153*a* of the magnet 147 during film deposition. According to this cleaning treatment, it is possible to perform in-situ cleaning in the chamber.

In the case where film deposition is applied intermittently, it is possible to suppress adherence of foreign substances to the substrate by controlling the accumulated value of the film thickness. That is, in the film deposition process using a sputtering method, film deposition until the target film thickness is reached is divided into a plurality of times by dividing one film deposition time into times in which particles do not grow enormously in a gas phase, a standby time for vacuum evacuation is provided for each time, the accumulated value of the film thickness is further managed and the cleaning treatment is carried out when a certain film thickness is reached, thereby it is possible to prevent the adhesion of foreign substances to the substrate.

As considered in the present embodiment, when the intermittent film deposition method by a sputtering method is applied to the film deposition process of a second electrode of an organic EL element, it is possible to reduce the number of L size foreign substances attached above the organic EL element. As a result, in the case of arranging a sealing layer above the organic EL element, it is possible to reduce defects in the sealing layer caused by the presence of foreign substances. In this way, it is possible to prevent deterioration of the organic EL element, and reliability can be improved in a display device in which pixels are formed with an organic EL element.

Second Embodiment

Figure 5:
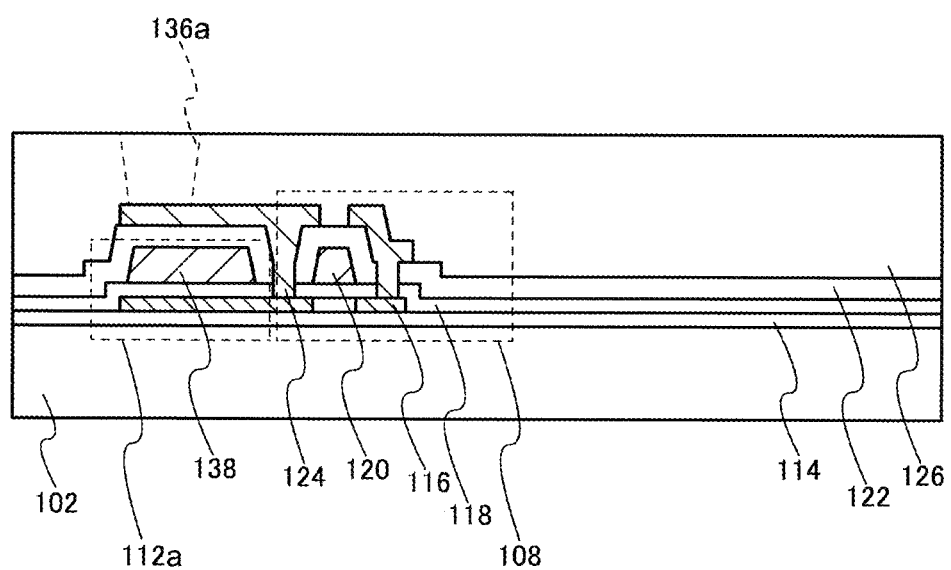
FIG. 5 is a cross-sectional diagram for explaining a manufacturing process of a display device related to one embodiment of the present invention.
Figure 6:
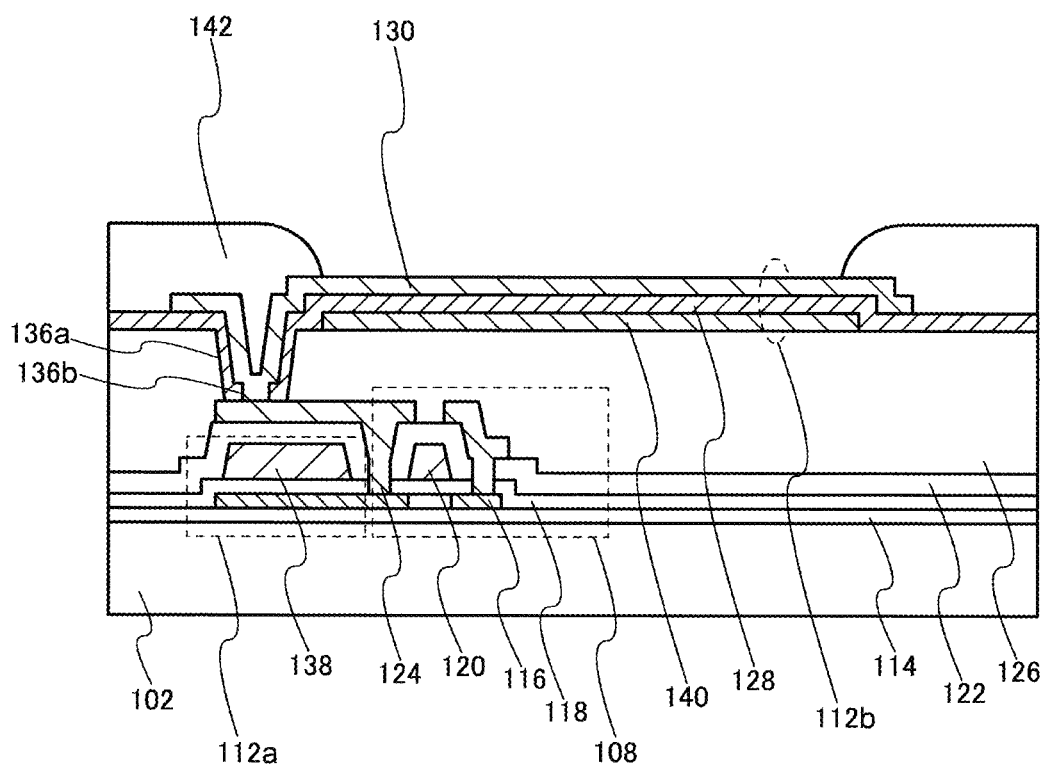
FIG. 6 is a cross-sectional diagram for explaining a manufacturing process of a display device related to one embodiment of the present invention.
Figure 7:
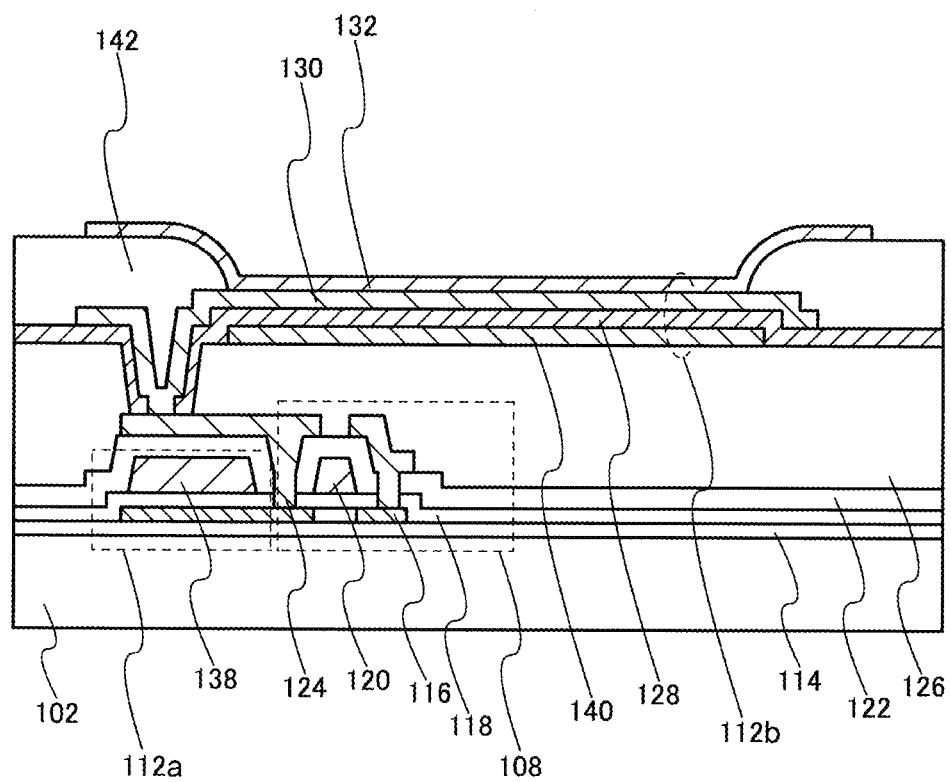
FIG. 7 is a cross-sectional diagram for explaining a manufacturing process of a display device related to one embodiment of the present invention.
Figure 9:
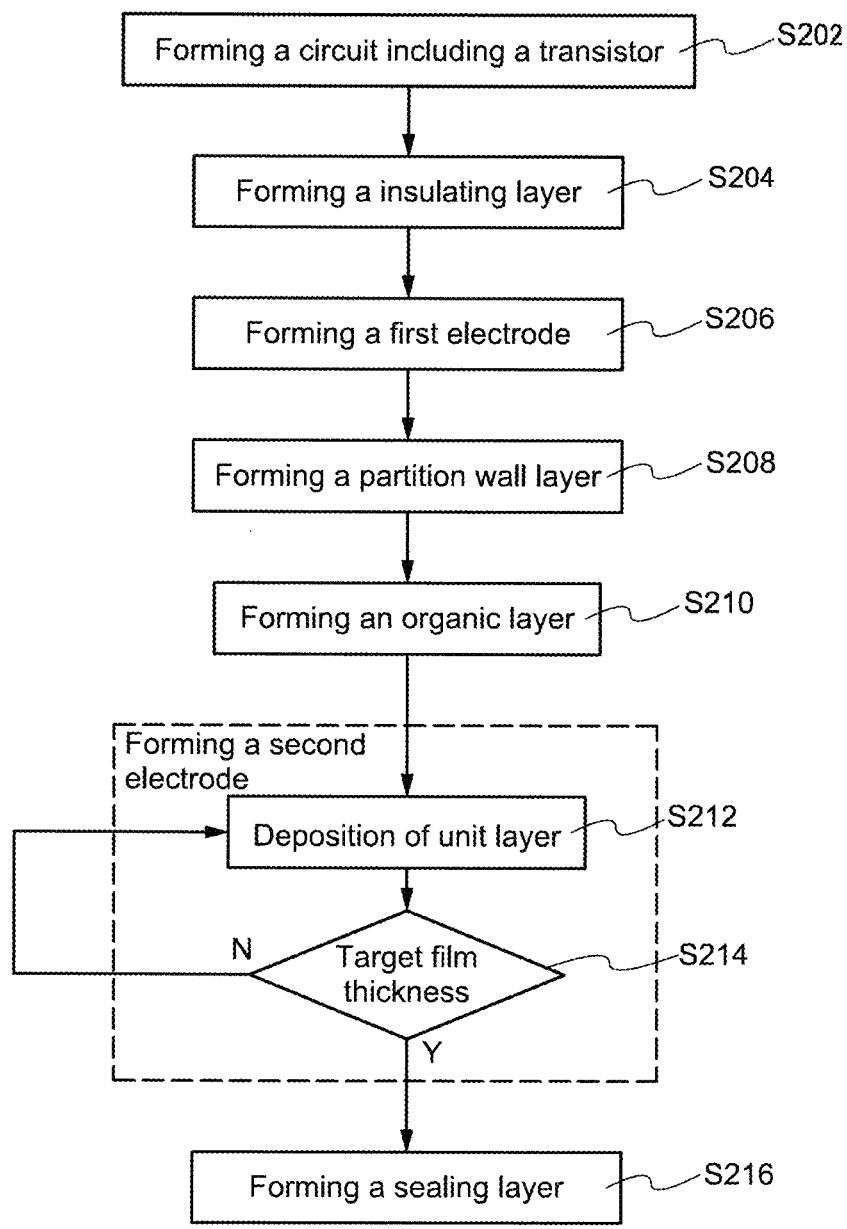
FIG. 9 is a flowchart for explaining a manufacturing process of a display device related to one embodiment of the present invention.

In the present embodiment, a method of manufacturing the display device 100 using the intermittent film deposition method shown in the first embodiment is explained while referring to the flowchart shown in FIG. 9 and the cross-sectional views of the pixel shown in FIG. 5, FIG. 6 and FIG. 7.

A circuit including a transistor is formed above the substrate 102 (S202 shown in FIG. 9), and an insulating layer for burying the transistor is formed (S204 shown in FIG. 9). FIG. 5 shows a cross-sectional view of one of the plurality of pixels 106 at this stage. FIG. 5 shows a structure in which an underlying insulating layer 114, the transistor 108 (a structure including the semiconductor layer 116, the gate insulating layer 118 and the gate electrode 120) and the first capacitor element 112*a* (a first capacitor electrode 138, the gate insulating layer 118, and the source/drain electrode 124), the first insulating layer 122, the source/drain electrode 124 and the second insulating layer 126 are formed.

The transistor 108 and the first capacitor 112*a* are explained while referring to FIG. 2 in the first embodiment. FIG. 5 exemplifies one of the transistors included in each of the plurality of pixels 106. A circuit including a transistor is not limited to a pixel circuit and includes a drive circuit arranged on the outer side of the pixel part.

The first insulating layer 122 is formed on the upper surface of the transistor 108. The first insulating layer 122 is formed from a single layer or a plurality of layers. For example, the first insulating layer 122 is formed by stacking a silicon nitride film and a silicon oxide film. The first insulating layer 122 is formed by a plasma CVD (Chemical Vapor Deposition) method or a sputtering method. The contact hole 136*a* which opens a part of the semiconductor layer 116 is formed in the first insulating layer 122. The source/drain electrode 124 is formed on the first insulating layer 122 aligned with the position of the contact hole 136*a*.

Furthermore, the second insulating layer 126 which buries the source/drain electrode 124 is formed on the first insulating layer 122.

The second insulating layer 126 is formed using an organic insulating material such as polyester resin, polyamide resin, polyimide resin, or polysiloxane resin or the like. The second insulating layer 126 is formed on substantially the entire surface of the substrate 102 using such an organic insulating material by a spin coating method, an inkjet method, a lamination method, a printing method, a dip coating method or a vapor deposition polymerization method. It is preferred that the second insulating layer 126 has a thickness of 1 μm or more. By forming the second insulating layer 126 using such an organic insulating material with such a thickness, irregularities caused by the transistor 108 and the source/drain electrode 124 are buried and a flat surface is formed. Following this, the contact hole 136*a* which opens a part of the source/drain electrode 124 is formed in the second insulating layer 126.

The first electrode 130 is formed above the second insulating layer 126 (S206 shown in FIG. 9). FIG. 6 shows a step of forming the first electrode 130 above the second insulating layer 126. Furthermore, a step of forming the second capacitor 112*b* may be included before fabrication of the first electrode 130. Although the second capacitor element 112*b* may be omitted in each of the plurality of pixels 106, in the explanation below, and explanation is given in a form which includes a step of forming the second capacitive element 112*b*.

The second capacitor electrode 140 is formed on the upper surface of the second insulating layer 126. Next, the third insulating layer 128 is formed to cover the second insulating layer 126 and the second capacitor electrode 140. The third insulating layer 128 is formed from a silicon nitride film or a silicon oxide film. The third insulating layer 128 is formed on substantially the entire surface of the second insulating layer by a plasma CVD method or a sputtering method. When the third insulating layer 128 is formed, a bottom surface of the contact hole 136*a* is covered by the third insulating layer 128. As a result, a contact hole 136*b* which overlaps the contact hole 136*a* is also formed in the third insulating layer 128.

The first electrode 130 is formed in alignment with the arrangement of each pixel of the display device. As is shown in FIG. 6, the first electrode 130 is formed above the third insulating layer 128 so as to include a part in contact with the source/drain electrode 124. The first electrode 130 is formed from a transparent conductive film such as ITO, IZO, AZO or GZO. In this case, the second capacitor electrode 140 is formed under the first electrode 130. In the case where the first electrode 130 is formed from a transparent conductive film, the second capacitor electrode 140 is formed of a metal film so that it can be used as a light reflecting plate. In addition, the first electrode 130 may be formed from a metal film or by stacking a metal film and a transparent conductive film. Specifically, the first electrode 130 is formed using a metal film such as aluminum (Al) or silver (Ag) or an alloy thereof. Alternatively, the first electrode 130 is formed by stacking such a metal film and a transparent conductive film such as ITO, IZO, AZO or GZO. Although the stacked structure of the first electrode 130 is arbitrary, for example, a stacked structure (for example, ITO/Al/ITO or the like) is formed as the first electrode 130 sandwiching a metal film between transparent conductive films. The first electrode 130 is arranged with a transparent conductive film having a high work function such as ITO on a surface in contact with an organic layer including an organic EL material, thereby hole injection properties to the organic film is improved.

Next, the partition wall layer 142 is formed (S208 shown in FIG. 9). The partition wall layer 142 is an insulating layer covering a periphery part of the first electrode 130 and opens an inner region. The partition wall layer 142 is formed using an organic insulating material such as acrylic resin or polyimide resin. Since the partition wall layer 142 is formed from an organic insulating material, a step caused by the first electrode 130 and a step caused by the contact hole 136a which is formed in the second insulating layer 126 can be buried. It is preferred that an end part of the opening part of the partition wall layer 142 is formed having a gentle tapered shape. If the opening end part of the partition wall layer 142 has a steep gradient, the organic layer and the second electrode manufactured in the next step break due to the step. However, if the opening end part of the partition wall layer 142 has a gentle tapered shape, it is possible to prevent the organic layer 132 and the second electrode 134 from breaking.

The organic layer 132 is formed on an upper surface of the first electrode 130 (S210 shown in FIG. 9). FIG. 7 shows a stage where the organic layer 132 is formed. The organic layer 132 is formed at least along the surface of the partition wall layer 142 from the upper surface of the first electrode 130 which is exposed from the partition wall layer 142. By forming the organic layer 132 in this way, the organic layer 132 can be securely arranged on the upper surface of the first electrode 130. The organic layer 132 is formed by a vacuum deposition method. The organic layer 132 is a layer including an organic EL material and is formed of a single layer or a plurality of layers. For example, the organic layer 132 is formed by appropriately combining a carrier injection layer, a carrier transport layer, a light emitting layer and a carrier block layer and the like. The organic layer 132 may be formed so that the organic EL material is different from an adjacent pixel and may be formed so that other layers such as a carrier transport layer have the same structure. In this way, different emitted light colors can be obtained between adjacent pixels which enables color display. In addition, the organic layer 132 may be formed to emit white light by a combination of a plurality of organic EL materials.

Figure 8:
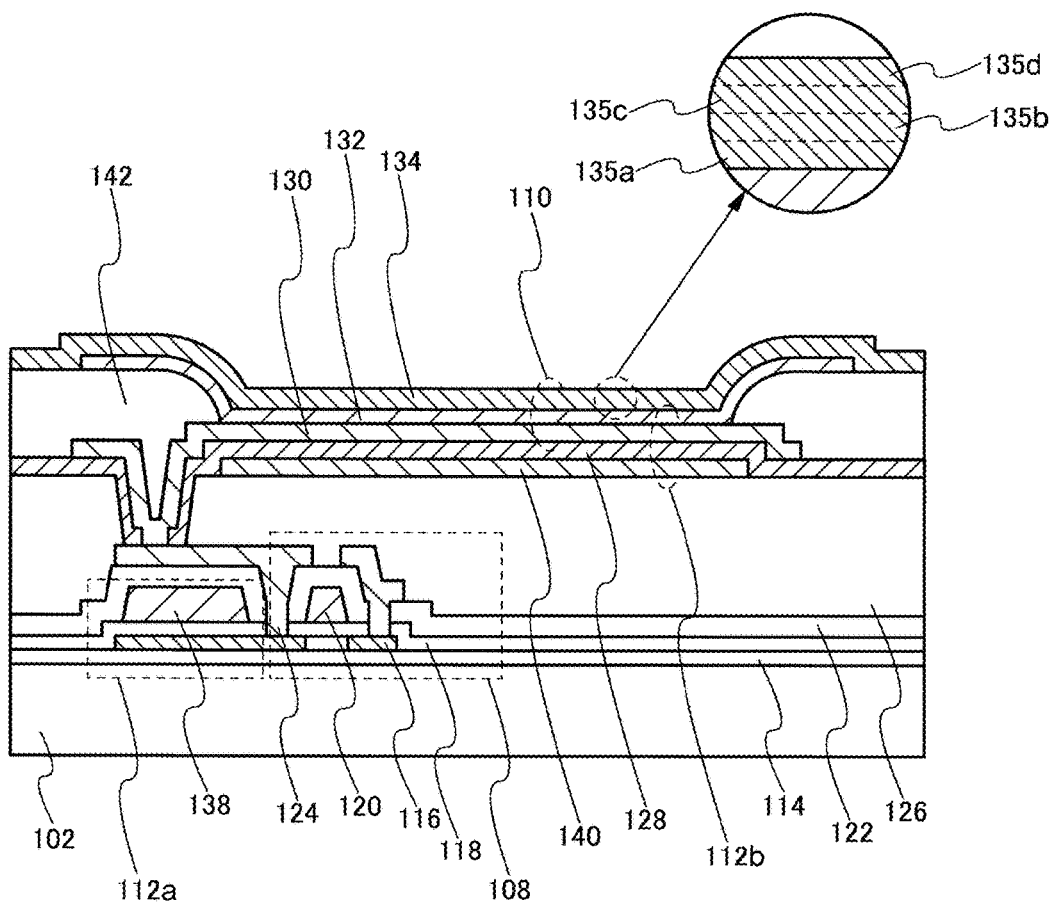
FIG. 8 is a cross-sectional diagram for explaining a manufacturing process of a display device related to one embodiment of the present invention.

The second electrode 134 is formed on the upper layer side of the organic layer 132 (S212 and S214 shown in FIG. 9). FIG. 8 shows a step of forming the second electrode 134. The second electrode 134 is formed by sputtering a transparent conductive film of ITO, IZO, AZO or GZO or the like. The second electrode 134 is formed with a film thickness of 100 nm to 300 nm, for example, 200 nm. This film deposition step is not to continuously form a film as was explained in the first embodiment but to repeat a plurality of times (S214) deposition of a unit layer which forms the second electrode 134 (S212) until the target film thickness is reached. For example, the second electrode 134 is formed by dividing the film deposition process into a plurality of times so that the film thickness deposited by one film deposition is 10 nm to 60 nm and the target film thickness of the second electrode 134 is reached. In one example, in the case when the target film thickness of the second electrode 134 is 200 nm, the growth film thickness per one time is set to 50 nm, and film deposition is carried out four times.

Specifically, as shown in the inset of FIG. 8, the second electrode 134 is formed separated into the film deposition step of the first electrode layer 135a, the film deposition step of the second electrode layer 135b, the film deposition step of the third electrode layer 135c and the film deposition step of the fourth electrode layer 135d. The film deposition step of the first electrode layer 135a, the film deposition step of the second electrode layer 135b, the film deposition step of the third electrode layer 135c and the film deposition step of the fourth electrode layer 135d may each have the same film thickness (constant film thickness). The film deposition step of the first electrode layer 135a, the film deposition step of the second electrode layer 135b, the film deposition step of the third electrode layer 135c and the film deposition step of the fourth electrode layer 135d may be carried out by using a film formed with the same composition and the same film thickness. In this way, it is possible to reduce variations in each layer. In this case, the film forming step of each electrode layer is carried out discretely with a predetermined time. A standby step is arranged in a period between a film forming step and the next film forming step during which the interior of the chamber of the sputtering apparatus is evacuated and held for a certain period of time. That is, the pressure at the standby stage is reduced compared to the sputtering pressure at the film forming stage. In this way, as explained in the first embodiment, it is possible to prevent foreign substances (in particular, foreign substances having a L size) from adhering to the film deposition surface in the sputtering film deposition step.

Although the film deposition process of the first electrode layer 135a, the second electrode layer 135b, the third electrode layer 135c and the fourth electrode layer 135d is carried out discontinuously, since the composition of each layer is the same, the boundary between each layer is not always clearly identified. However, the boundary of each layer may include at least one of carbon (C), nitrogen (N), and oxygen (O) which are elements forming a residual gas in the chamber in a delta function distribution.

Following this, the sealing layer 144 is formed on the second electrode 134 (S216). As was explained while referring to FIG. 2, the sealing layer 144 is formed using an inorganic insulating film such as a silicon nitride film or an aluminum oxide film. The thickness of the inorganic insulating film used as the sealing layer 144 is in the range of 0.5 μm to 10 μm, preferably in the range of 2 μm to 5 μm. Although the thickness of the sealing layer 144 improves barrier properties to water vapor and the like, since light transmittance is particularly lowered in the short wavelength band, the sealing layer 144 is preferably in the range described above.

By forming the second electrode 134 in a plurality of stages, the number of defective foreign substances is reduced on an underlying surface of the sealing layer 144. As a result, the organic EL element 110 which is arranged in each of the plurality of pixels 106 is reliably protected by the sealing layer 144. In addition, since the size of the L sized foreign substances which lead to defects in the sealing layer 144 is reduced, it is possible to reduce the thickness of the sealing layer 144 itself and attenuation of the light emitted from the organic EL element 110 can be suppressed.

A cover material may be arranged on the upper surface of the sealing layer 144. It is possible to form the cover material from a glass having translucency or a plastic plate member. The cover material 166 may be arranged with a color filter layer and a light shielding layer in alignment with the arrangement of the pixels. The color filter layer can be formed differently for each adjacent pixel, for example, so as to extract light emission of red, green and blue. The light shielding layer and the color filter layer may be arranged on an opposing substrate interposed by an underlying film, or an overcoat layer may be further arranged to cover the light shielding layer and the color filter layer. In addition, a touch sensor may be arranged on the cover member 166.

According to the present embodiment, since it is possible to reduce the number of foreign substances generated at the time of manufacturing a second electrode, it is possible to suppress the occurrence of defects in a sealing layer formed on an upper layer. In this way, it is possible to suppress deterioration of the organic EL elements which form a pixel and the occurrence of defects such as dark spots can be prevented. That is, according to the present embodiment, it is possible to improve the reliability of the display device.

Figure 10:
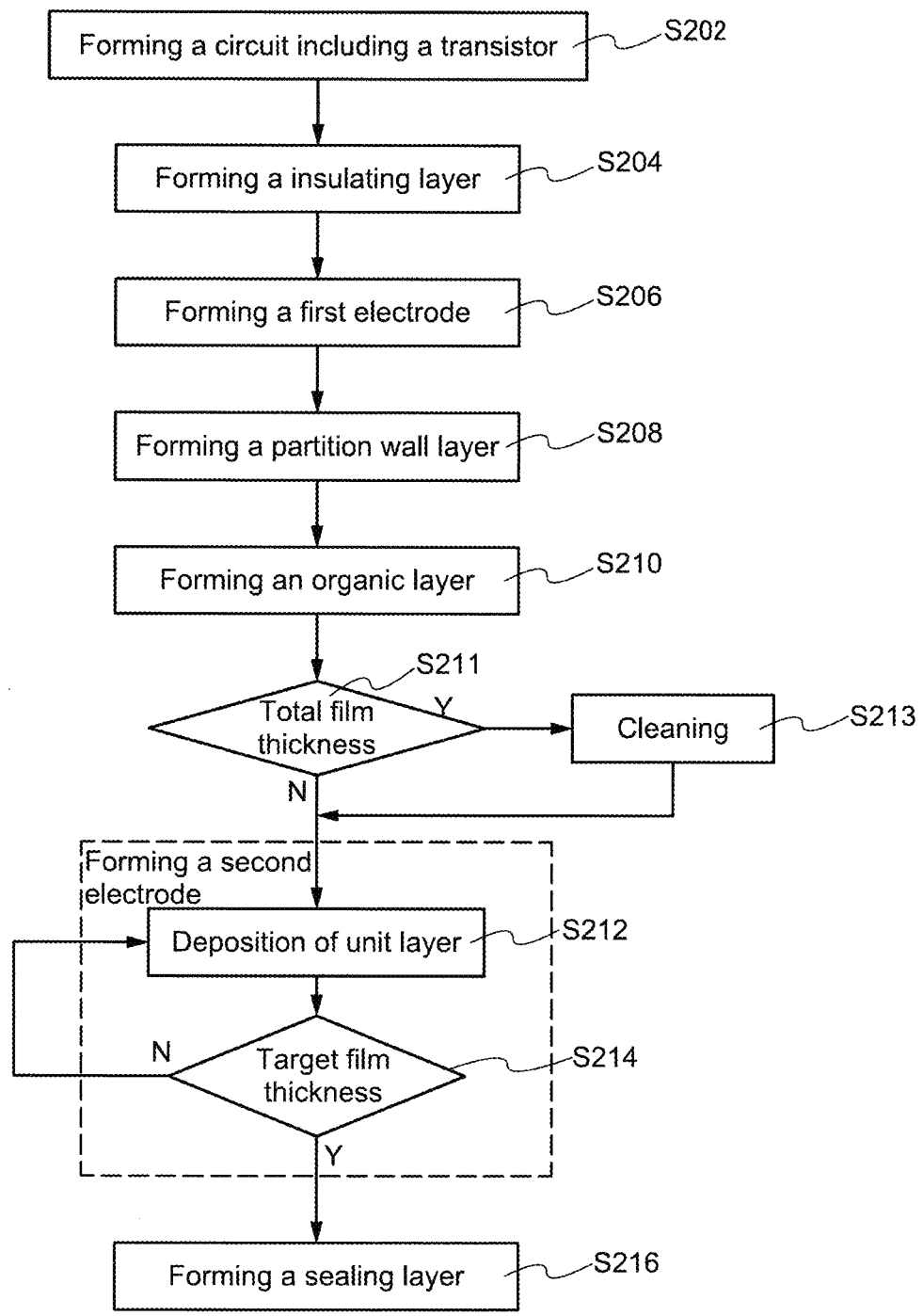
FIG. 10 is a flowchart for explaining a manufacturing process of a display device related to one embodiment of the present invention.

Furthermore, when forming the second electrode 134, the cleaning treatment may be applied to remove a reaction product which adheres to the non-erosion region of the sputtering target. That is, in the manufacturing process of the display device, in the case when the film deposition step of forming the second electrode is sequentially carried out for each of a plurality of substrates in the sputtering apparatus, as is shown in FIG. 10, the accumulated value of the film thickness is managed (S211) and in the case where the accumulated value of the film thickness exceeds a predetermined range, the cleaning treatment may be applied (S213). In other words, the film forming process is repeated until the number of foreign substances of 5 µm or more which adhere to a substrate reaches a certain level, the film forming process is continued until reaching a certain level, and then the cleaning treatment is applied. As was explained in the first embodiment, the cleaning treatment is carried out by widening a swinging range of a magnet so as to adhere to the non-erosion region of the sputtering target and remove the reaction product. By carrying out such a cleaning treatment between manufacturing lots of a display device or within a manufacturing lot, it is possible to suppress the attachment of angular shaped foreign substances to the substrate.

According to the present embodiment, when forming a second electrode, adhesion of foreign substances to the substrate is suppressed by carrying out intermittent film deposition processes, and by controlling the accumulated value of the film thickness per chamber, it is possible to suppress adhesion of foreign substances which cannot be suppressed just by the intermittent film forming method.

Furthermore, in the present embodiment, although a method for manufacturing a second electrode arranged under a sealing layer was exemplified, such a manufacturing method is similarly applied to manufacturing of other members of the display device. For example, an intermittent film deposition method may be applied to the manufacture of a first electrode of an organic EL element. In this way, foreign substances adhering to the first electrode can be suppressed and the occurrence of defects in an organic layer can be suppressed. In other words, since the foreign substances adhering to the first electrode are foreign substances of the target component, when there are foreign substances of a thickness equal to or larger than the film thickness of the organic layer, short circuits occur via the foreign substances between the first electrode and the second electrode. However, as shown in the present embodiment, by carrying out intermittent film deposition, such short circuit defects are suppressed.

What is claimed is:

1. A method for manufacturing a display device, the method comprising:
    forming an insulating layer embedding a transistor arranged on a substrate;
    forming a first electrode electrically connected with the transistor above the insulating layer;
    forming a partition wall layer having an opening part covering a periphery edge part of the first electrode and exposing an inner side region of the first electrode;
    forming an organic layer including an organic electroluminescent material above the first electrode;
    forming a second electrode above the partition wall layer and the organic layer; and
    forming a sealing layer above the second electrode, wherein
    the forming of the second electrode includes a film deposition step of a unit electrode layer, and a waiting step after completion of the film deposition step of the unit electrode layer, and
    the film deposition step of the unit electrode layer and the waiting step are repeated until a total thickness of the second electrode layer reaches a target film thickness.

2. The method according to claim 1, wherein a film thickness of the unit electrode layer to be formed in each the film deposition step is constant and the film deposition step and the waiting step are repeated until the desired film thickness is reached.

3. The method according to claim 1, wherein a film thickness and composition of each the unit electrode layer to be formed in each the film deposition step are constant and the film deposition step and the waiting step are repeated until the desired film thickness is reached.

4. The method according to claim 1, wherein the unit electrode layer to be formed in the film deposition step is formed by a transparent conductive film.

5. The method according to claim 4, wherein the transparent conductive film is one type selected from indium tin oxide, indium zinc oxide, zinc oxide doped with aluminum or zinc oxide doped with gallium.

6. The method according to claim 1, wherein the second electrode is fabricated by a sputtering method.

7. The method according to claim 6, wherein pressure of the waiting step is low with respect to sputtering pressure in the film deposition step.

8. The method according to claim 7, wherein the waiting step is carried out under a vacuum evacuation.

9. The method according to claim 1, wherein the film deposition step for forming the second electrode is carried out successively for each of a plurality of the substrates in a sputtering apparatus.

10. The method according to claim 9, wherein the film deposition step for forming the second electrode is carried out successively for each of a plurality of the substrates until an accumulated value of the film thickness of the unit electrode layer to be formed reaches a fixed standard.

11. The method according to claim 10, wherein a cleaning treatment is carried out in the sputtering apparatus when the fixed standard is reached so as to remove a deposit of a sputtering target attached to the sputtering apparatus.

12. The method according to claim 11, wherein the cleaning treatment is a removal treatment of the deposit attached to a non-erosion region of the sputtering target.

13. The method according to claim 12, wherein the cleaning treatment is a treatment for widening a swing range of a magnet arranged on a rear surface of the sputtering target up to the non-erosion region.

* * * * *